(12) United States Patent
Kim et al.

(10) Patent No.: US 9,480,147 B2
(45) Date of Patent: Oct. 25, 2016

(54) TOUCH WINDOW

(71) Applicant: LG INNOTEK CO., LTD., Seoul (KR)

(72) Inventors: Byeong Seob Kim, Seoul (KR); Ji Sung Ahn, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 107 days.

(21) Appl. No.: 14/483,749

(22) Filed: Sep. 11, 2014

(65) Prior Publication Data

US 2015/0223324 A1    Aug. 6, 2015

(30) Foreign Application Priority Data

Feb. 5, 2014    (KR) .................... 10-2014-0013310

(51) Int. Cl.
| | |
|---|---|
| *H05K 1/02* | (2006.01) |
| *G06F 1/16* | (2006.01) |
| *G06F 3/044* | (2006.01) |
| *H05K 3/36* | (2006.01) |

(52) U.S. Cl.
CPC ........... *H05K 1/0259* (2013.01); *G06F 1/1643* (2013.01); *G06F 3/044* (2013.01); *G06F 2203/04107* (2013.01); *H05K 3/361* (2013.01); *H05K 2201/09227* (2013.01); *H05K 2201/09272* (2013.01); *H05K 2201/09281* (2013.01); *H05K 2201/09727* (2013.01)

(58) Field of Classification Search
CPC ................ H05K 1/0259; H05K 2201/09272; H05K 2201/09227; H05K 3/361; H05K 2201/09281; H05K 2201/09727; H05K 1/0254; H05K 9/0064; H05K 9/006; G06F 1/16; G06F 2203/04107; G06F 2203/04103; G06F 3/041–3/04897; G06F 2203/04102; G06F 2203/04112; G06F 1/1643
See application file for complete search history.

(56) References Cited

U.S. PATENT DOCUMENTS

| 2011/0057887 | A1* | 3/2011 | Lin | ..................... G06F 3/044 345/173 |
| 2012/0075214 | A1* | 3/2012 | Kim | ..................... G06F 3/041 345/173 |
| 2012/0075218 | A1* | 3/2012 | Lin | ..................... G06F 3/0418 345/173 |
| 2012/0127094 | A1 | 5/2012 | Jeong | ..................... 345/173 |
| 2013/0062179 | A1* | 3/2013 | Ye | ..................... G06F 3/041 200/512 |
| 2013/0215082 | A1* | 8/2013 | Mi | ..................... G06F 3/044 345/174 |

(Continued)

FOREIGN PATENT DOCUMENTS

| KR | 10-2009-0114505 A | 11/2009 |
| KR | 10-2012-0053855 A | 5/2012 |

OTHER PUBLICATIONS

LG G2, Wikipedia Article, http://en.wikipedia.org/wiki/LG_G2, last visited Sep. 11, 2014 (screenshot provided).

*Primary Examiner* — Nalini Mummalaneni
*Assistant Examiner* — Ivelisse Martinez Quiles
(74) *Attorney, Agent, or Firm* — KED & Associates, LLP

(57) ABSTRACT

A touch window includes a substrate, a sensing electrode on the substrate, a wire electrically connected with the sensing electrode, a ground wire adjacent to the wire, and a printed circuit board connected with the wire and the ground wire. An overlap length between the ground wire and the printed circuit board is longer than an overlap length between the wire and the printed circuit board. Alternatively or simultaneously, a line width of the ground wire is wider than an interval or gap between the wire parallel to the printed circuit.

16 Claims, 13 Drawing Sheets

(56) References Cited

U.S. PATENT DOCUMENTS

2014/0000939 A1* 1/2014 Kim .................. H05K 1/02
                                                174/250

2014/0138141 A1* 5/2014 Li .................. H05K 1/0259
                                                174/261

* cited by examiner

TOUCH WINDOW

CROSS-REFERENCE TO RELATED APPLICATION

This application claims priority under 35 U.S.C. §119 to Korean Application No. 10-2014-0013310 filed on Feb. 5, 2014, whose entire disclosure is hereby incorporated by reference.

BACKGROUND

1. Field

The disclosure relates to a touch window.

2. Background

A touch window is installed on a display surface of an image display device such as a cathode ray tube (CRT), a liquid crystal display (LCD), a field emission display (FED), a plasma display panel (PDP), and an electro-luminescence device (ELD), so that a user inputs predetermined information into an electronic appliance by pressing the touch panel while viewing the image display device.

In the touch window, the interference with an electrical signal occurs when electro-static discharge (ESD) occurs such that the accuracy of the touch may be deteriorated or the reliability of the touch window may be degraded. A ground wire is provided for the protection from the ESD. Further, the ESD protection performance is enhanced by widening the width of the ground wire.

If the width of the ground wire is widened, the width of a bezel of the touch window may be widened which conflicts with the needs for a narrow bezel to ensure a wide screen. However, if the width of the ground wire is reduced in order to meet the needs for the narrow bezel, the reliability of the device may be deteriorated due to the degradation in the ESD protection performance.

BRIEF DESCRIPTION OF THE DRAWINGS

The embodiments will be described in detail with reference to the following drawings in which like reference numerals refer to like elements wherein.

DETAILED DESCRIPTION

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
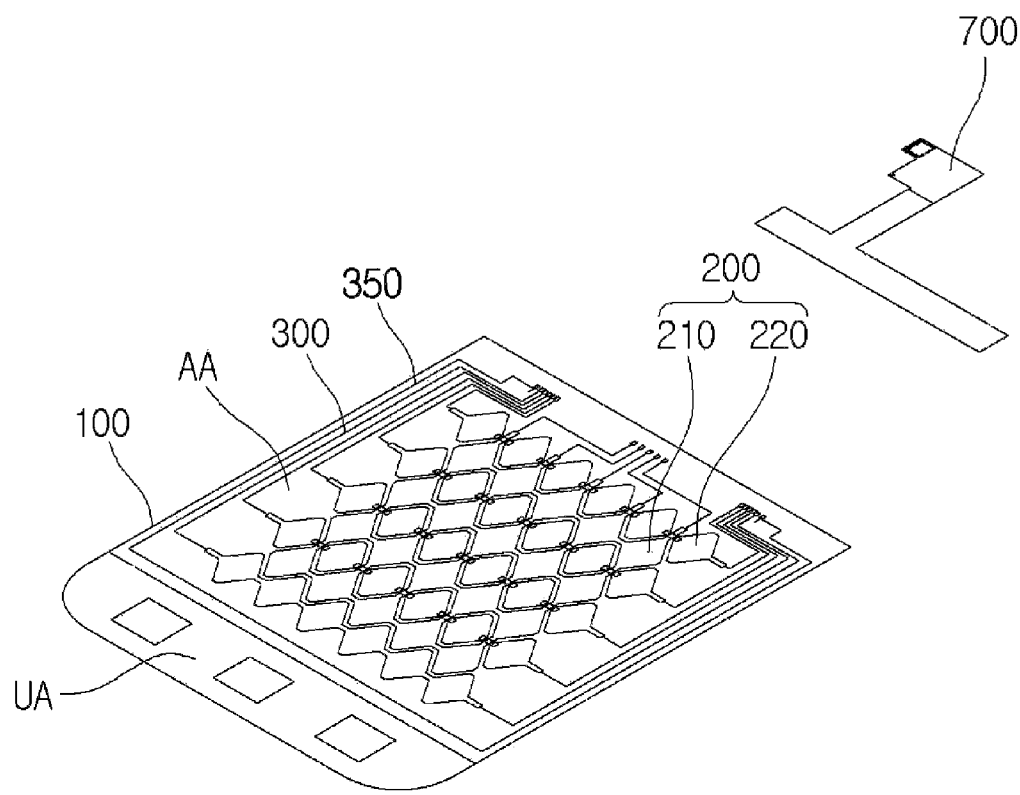
FIG. 1 is a perspective view showing a touch window according to the embodiment.
Figure 2:
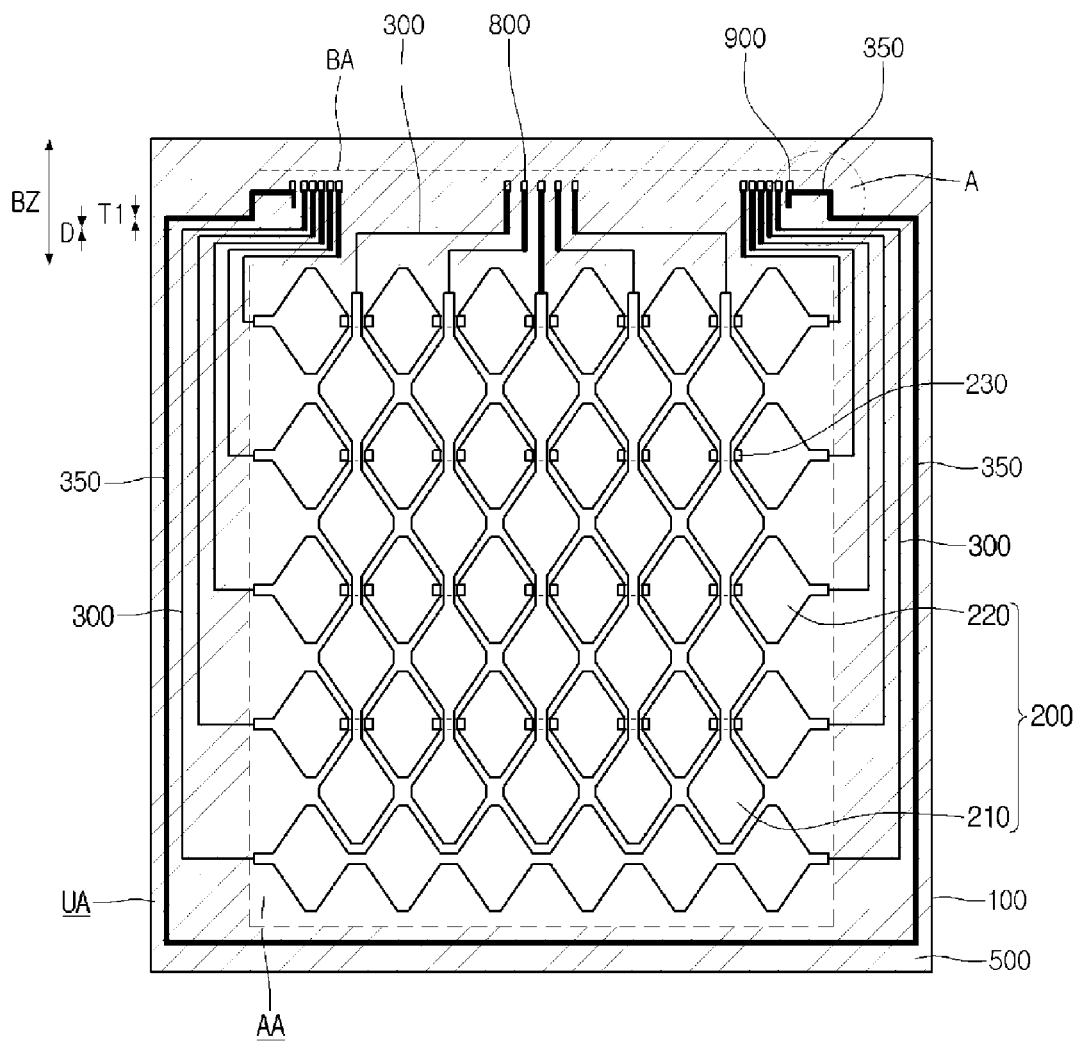
FIG. 2 is a top view showing the touch window according to the embodiment.

Referring to FIGS. 1 and 2, a touch window according to the embodiment may include a cover window 100, a sensing electrode 200, a wire 300, a ground wire 350, and a printed circuit board 700. The cover window 100 may be rigid or flexible. For example, the cover window 100 may include glass or plastic. For example, the cover window 100 may include tempered glass, half-tempered glass, soda lime glass, reinforced plastic, or flexible plastic.

The cover window 100 may include an active area AA and an inactive or unactive area UA. The active area AA refers to an area through which a touch instruction may be input by a user, and the unactive area UA refers to an area to which the touch instruction is not input. The unactive area UA is not activated even if the touch of the user is input thereto.

An electrode may be provided in the active area AA of the cover window 100. For example, the sensing electrode 200 may be provided on the active area AA. The sensing electrode 200 may include a driving electrode to transmit a signal and a receiving electrode to receive a signal. For example, the sensing electrode 200 may include a first sensing electrode 210 and a second sensing electrode 220. The first sensing electrode 210 may serve as a driving electrode, and the second sensing electrode 220 may serve as a receiving electrode, but the embodiment is not limited thereto.

The first and second sensing electrodes 210 and 220 may be formed through various schemes according to the structure of the touch panel. For example, the first and second sensing electrodes 210 and 220 may be formed together on one surface of the cover window 100. In this case, a bridge electrode 230 may be formed to connect first sensing electrodes 210 or second sensing electrodes 220 with each other.

As shown in FIG. 2, the bridge electrode 230 may be provided to connect second sensing electrode 220, which are provided under the bridge electrode 230, with each other, but the embodiment is not limited thereto. Accordingly, the bridge electrode 230 may be provided to connect first sensing electrodes 210, which are provided on the bridge electrode 230, with each other.

The bridge electrode 230 or the sensing electrode 200 may include a transparent conductive material. For example, the bridge electrode 230 or the sensing electrode 200 may include a transparent conductive material such as indium zinc oxide (IZO) or indium tin oxide (ITO). The bridge electrode 230 and the sensing electrode 200 may include the same material or materials different from each other.

Although FIG. 2 shows that the sensing electrode 200 is shown in the shape of a diamond, the embodiment is not limited thereto. Accordingly, the sensing electrode 200 may have various shapes, such as a polygonal shape including a triangular shape or a quadrangular shape, a circular shape, an oval shape, a linear shape or an H shape.

The bridge electrode 230 may be also provided in a bar shape. The bridge electrodes 230 may be spaced apart from each other by a predetermined interval and may be provided in the bar shape on the active area AA. The bridge electrode 230 may serve as a connection electrode to connect second sensing electrodes 210 with each other, but the embodiment is not limited thereto.

The sensing electrode 200 may be provided on the active area AA. The sensing electrode 200 may be provided on the active area AA to serve as a sensor to sense a touch. The first sensing electrode 210 extending in one direction and the second sensing electrode 220 extending in a direction different from one direction may be provided on the active area AA. The touch window according to the embodiment may have various structure according to positions in which the first and second sensing electrodes 210 and 220 are formed as described above. However, the embodiment is not limited thereto, but the first and second sensing electrodes 210 and 220 may be formed in various positions.

If an input device by a finger or input device approaches or contacts the touch window, the variation of capacitance occurs in the vicinity of the input, and the variation of the capacitance may be detected as a touch point.

A printing layer 500 may be provided in the unactive area UA. For example, the printing layer 500 may be provided while extending along an edge of the cover window 100. The printing layer 500 may be formed through one color printing, two color printing, or three color printing. The printing layer 500 may be formed by coating black ink or white ink according to a desired outer appearance. The printing layer 500 may prevent the wire 300, which is described later, from being viewed from an outside. In addition, a pattern may be formed on the printing layer 500 so that a desired logo may be realized.

The wire 300 may be formed in the unactive area UA to electrically connect the sensing electrodes 200 with each other. One end of the wire 300 may be connected with the sensing electrode 200, and an opposite end of the wire 300 may be connected with the printed circuit board 700. For example, the wire 300 may be connected with the sensing electrode 200 and drawn from an upper end or a lower end of the cover window 100. In addition, a first pad part 800 is provided at the opposite end of the wire 300 for the connection with the printed circuit board 700.

The ground wire 350 may be provided adjacent to the wire 300. The width of the ground wire 350 may be larger than that of the wire 300. The ground wire 350 may perform an electro-static discharge (ESD) protection function in the touch window. For example, as the ESD moves along the path of the ground wire 250, the ground wire 350 may prevent the ESD from being introduced into the touch window.

Since the ground wire 350 is provided along the edge of the cover window 100, the ground wire 350 can prevent the ESD from being introduced into the touch window. The ground wire 350 may be provided along the edges of the cover window 100. The ground wire 350 may make contact with the printed circuit board 700 to discharge the ESD from the inner part of the touch window in the form of an electrical signal. Accordingly, signal interference can be prevented, so that the accuracy and the reliability of the touch can be improved.

The ground wire 350 may include the same material as that of the wire 300 or a material similar to that of the wire 300. One end of the ground wire 350 may be connected with the printed circuit board 700. The ground wire 350 may be drawn from an upper end or a lower end of the cover window 100. A second pad part 900 is provided at one end of the ground wire 350 for the connection with the printed circuit board 700

An area of the cover window 100, in which the printed circuit board 700 is provided, may be defined as a bonding part BA. In other words, the bonding part BA is an area of the cover window 100 in which the cover window 100 is overlapped with the printed circuit board 700. The first and second pad parts 800 and 900 may be provided in the bonding part BA. The printed circuit board 700 may be provided in the bonding part BA so that the bonding part BA may be bonded to the printed circuit board 700.

Figure 3:
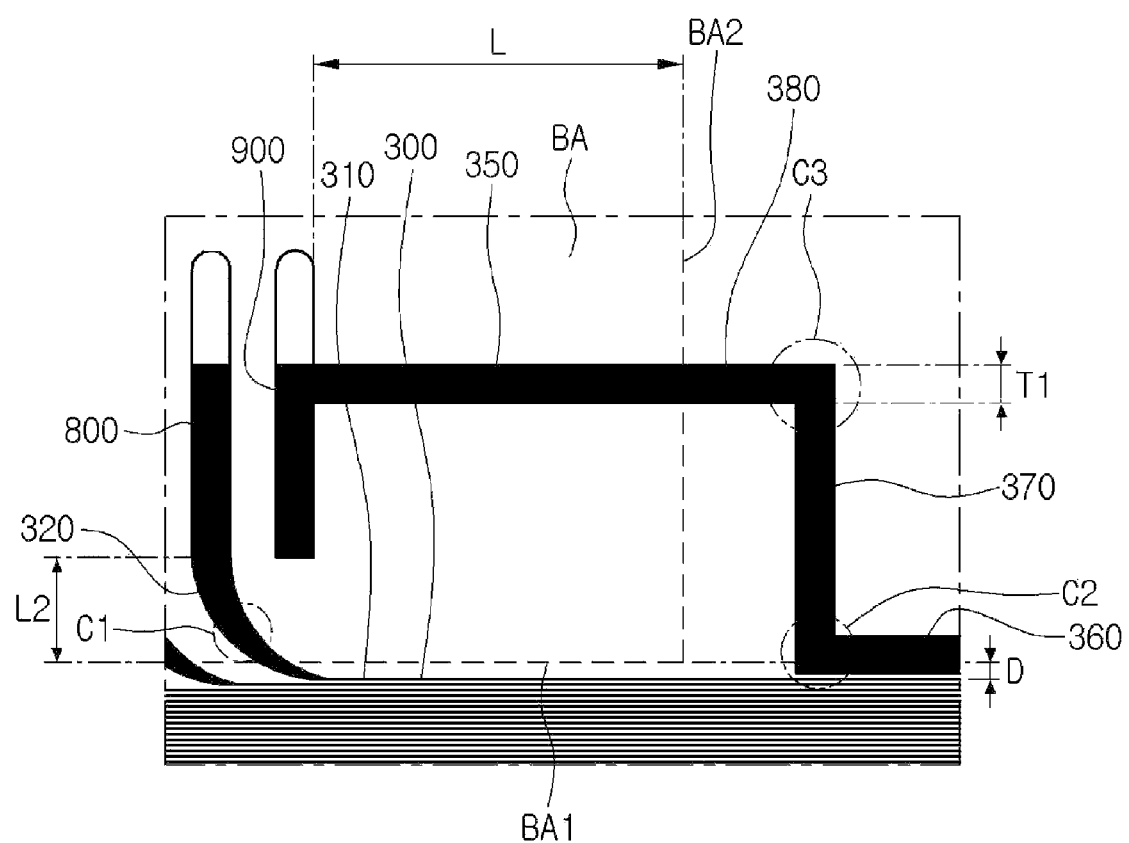
FIG. 3 is an enlarged view showing a part A of FIG. 2.

Referring to FIGS. 2 and 3, an overlap length L between the ground wire 350 and the printed circuit board 700 is longer than an overlap length L2 between the wire 300 and the printed circuit board 700. The overlap length L between the ground wire 350 and the bonding part BA is longer than the overlap length L2 between the wire 300 and the bonding part BA.

Accordingly, different from the wire 300, the ground wire 350 is detoured to the bonding part BA to make contact with the second pad part 900. In other words, a portion of the ground wire 350 may be provided at a lateral side of the printed circuit board 700. In addition, a portion of the ground wire 350 may be provided at a lateral side of the bonding part BA.

The bonding part BA may include one side BA1 and another side BA2 bent from one side BA1. The wire 300 may include a first wire part 310 parallel to one side BA1 of the bonding part BA and a second wire part 320 bent from the first wire part 310 and crossing one side BA1. The second wire part 320 may cross one side BA1 and make contact with the first pad part 800. In other words, the second wire part 320 may make contact with one side BA1.

The ground wire 350 may include a first ground wire 360 parallel to one side BA1 of the bonding part BA, a second ground wire 370 bent from the first ground wire 360 and crossing one side BA1, and a third ground wire 380 bent from the second ground wire 370 and crossing another side BA2.

In this case, the third ground wire 380 may make contact with the second pad part 900. In other words, the third ground wire 380 may make contact with the second pad part 900 while crossing another side BA2 of the bonding part BA. The third ground wire 380 may first make contact with another side BA2 without making contact with one side BA1.

Meanwhile, the number of bent parts C2 and C3 of the ground wire 350 may be larger than the number of bent part C1 of the wire 300. On the substrate 100 having the bonding part BA, the bending number of the ground wire 350 may be larger than the bending number of the wire 300. At an area adjacent to the bonding part BA, the bending number of the ground wire 350 may be larger than the bending number of the wire 300.

The number of the bent parts C2 and C3 formed due to the directionality change of the ground wire 350 may be larger than the number of the bent part C1 formed due to the directionality change of the wire 300. This is because the ground wire 350 makes a detour to a part in which the printed circuit board 700 is provided. For example, referring to FIG. 3, the number of bent parts C2 and C3 of the ground wire 350 may be two, and the number of the bent part C1 of the wire 300 may be one.

According to the embodiment, an interval D between the wire 300 and the printed circuit board 700 may be narrower than a line width T1 of the ground wire 350. The interval D between the wire 300 and the bonding part BA may be narrower than the line width T1 of the ground wire 350. The interval D may be the minimum distance between one side of the bonding part BA and the wire 300 parallel to one side of the bonding part BA.

The line width T1 of the ground wire 350 may be wider than an interval D between the wire 300, which is parallel to the printed circuit board 700, and the printed circuit board 700. The interval D between the wire 300 and the printed circuit board 700 is included in a bezel (BZ) provided at an upper portion of the touch window, so that the width of the bezel can be reduced.

The width of the bezel (BZ) may be reduced by the line width T1 of the ground wire 350, so that the active area AA can be enlarged. According to the embodiment, a wider screen can be ensured.

Since the ground wire 350 is detoured to the bonding part BA, even if the line width T1 of the ground wire 350 is wider than that of the related art, the wider line width T1 of the ground wire 350 does not exert an influence on the size of the bezel BZ. Therefore, the line width T1 of the ground wire 350 is in the range of 0.03 mm to 0.4 mm, so that the ESD protection function can be enhanced.

The size of the bezel BZ may be reduced by the line width T1 of the ground wire 350. The size of the bezel BZ can be reduced by 0.03 mm to 0.4 mm when comparing with the size of a bezel according to the related art. Therefore, the interval D between the bonding part BA and the wire 300 closest to the bonding part BA may be in the range of 0.01 mm to 0.03 mm.

Figure 4:
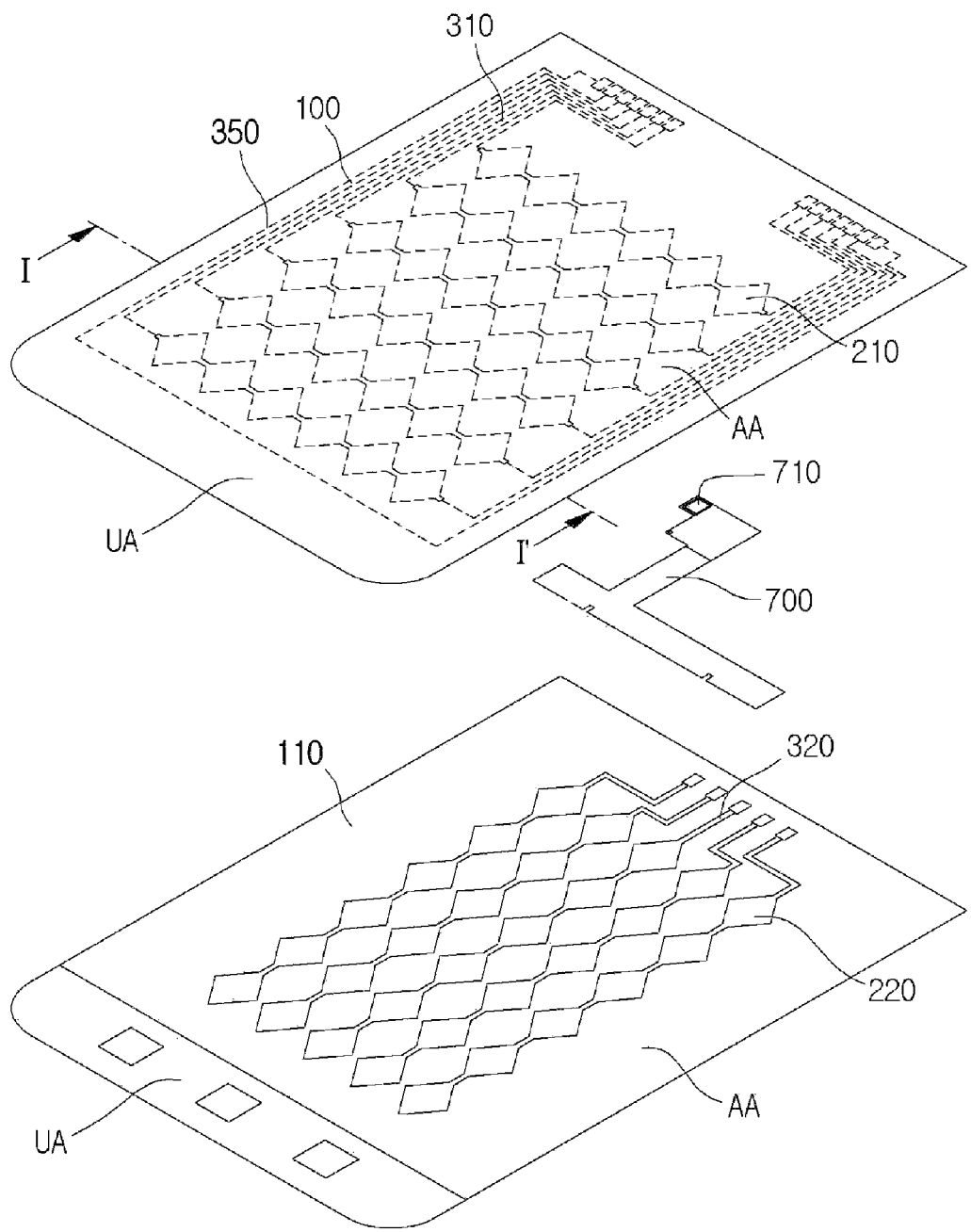
FIGS. 4 to 8 are perspective views showing a touch window according to another embodiment.

Referring to FIG. 4, the first sensing electrode 210 may be formed on one surface of the cover window 100, and the second sensing electrode 220 may be formed on one surface of the substrate 110 provided under the cover window 100. In this case, the ground wire 350 may be provided on the cover window 100.

Figure 5:
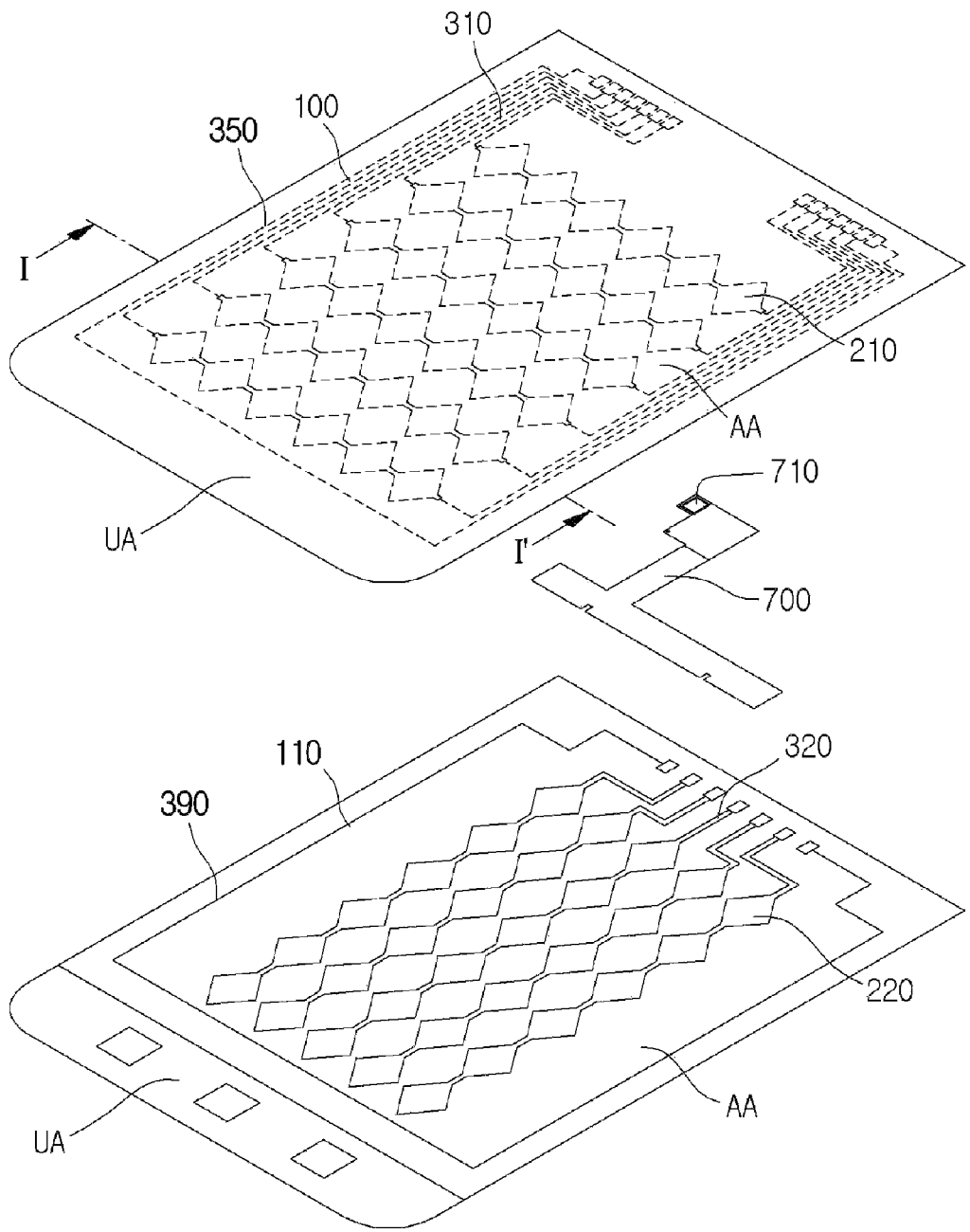

Referring to FIG. 5, a ground wire according to another embodiment may include the ground wire 350 provided on the cover window 100 and a ground wire 390 provided on the substrate 110.

Figure 6:
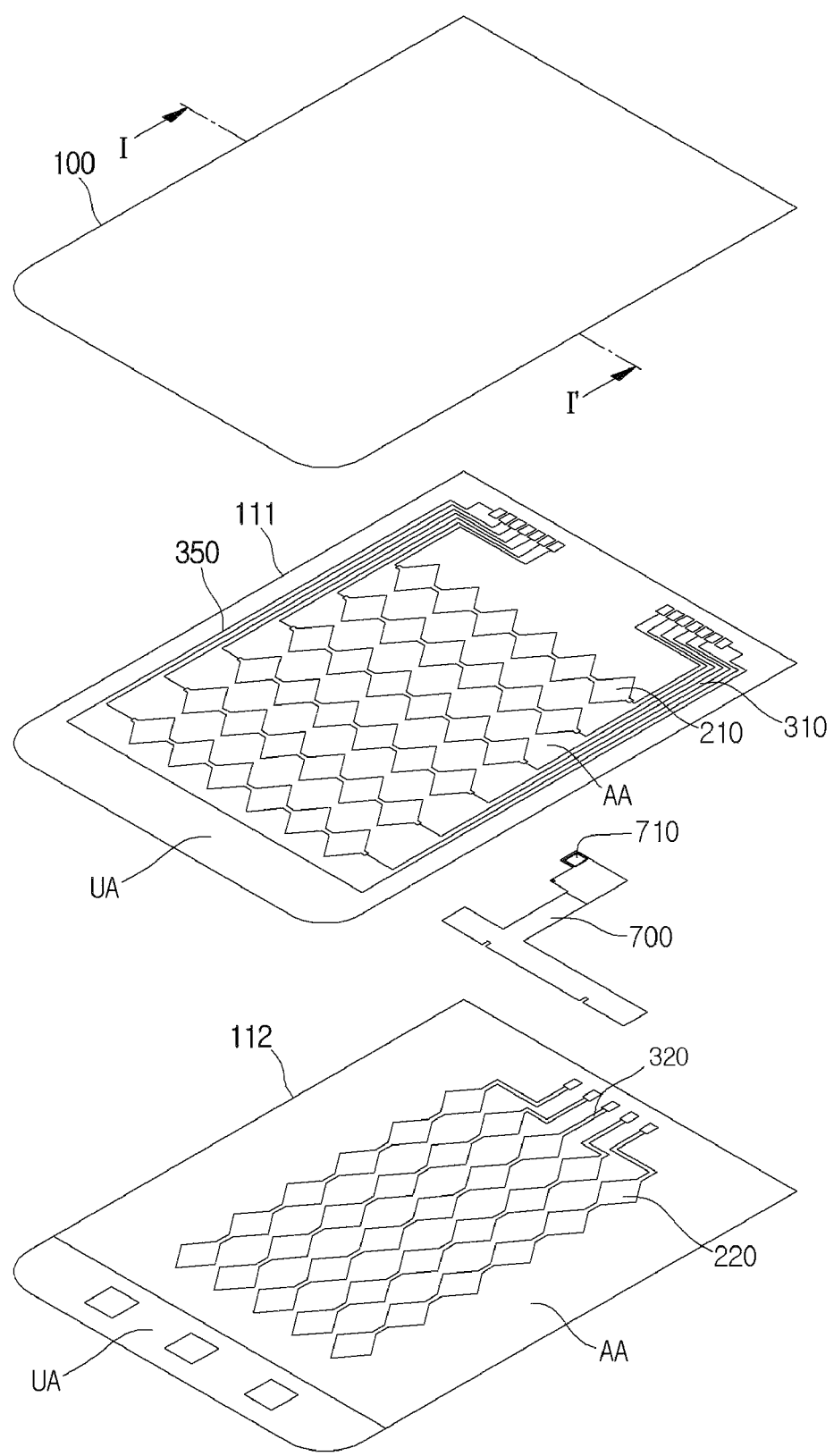

Referring to FIG. 6, the first sensing electrode 210 may be formed on one surface of a first substrate 111 provided under the cover window 100, and the second sensing electrode 220 may be formed on a second substrate 112 provided under the first substrate 111. The ground wire 350 may be provided on the first substrate 111.

Figure 7:
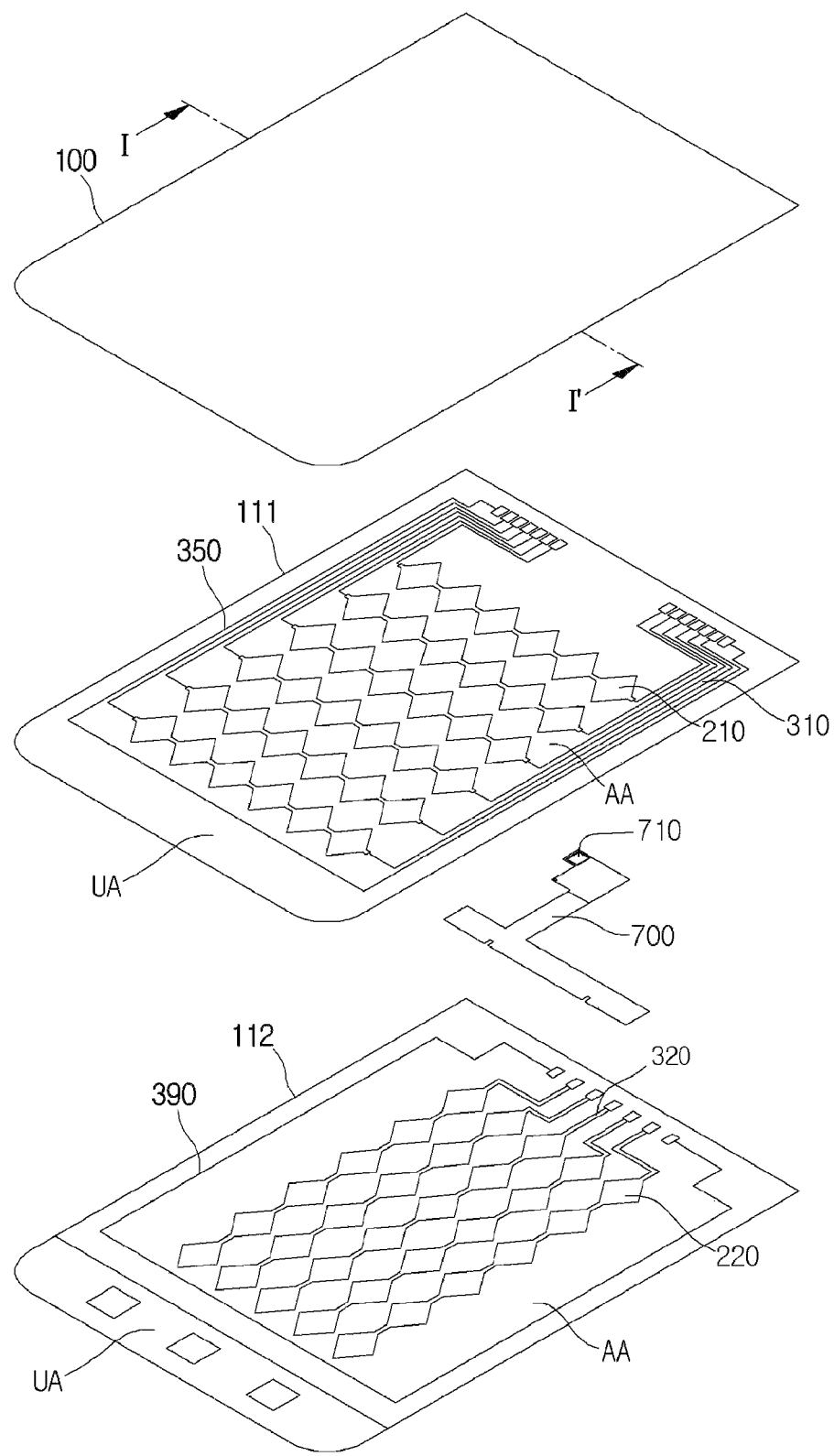

Referring to FIG. 7, a ground wire may include the ground wire 350 provided on the first substrate 111 and the ground wire 390 provided on the substrate 112.

Figure 8:
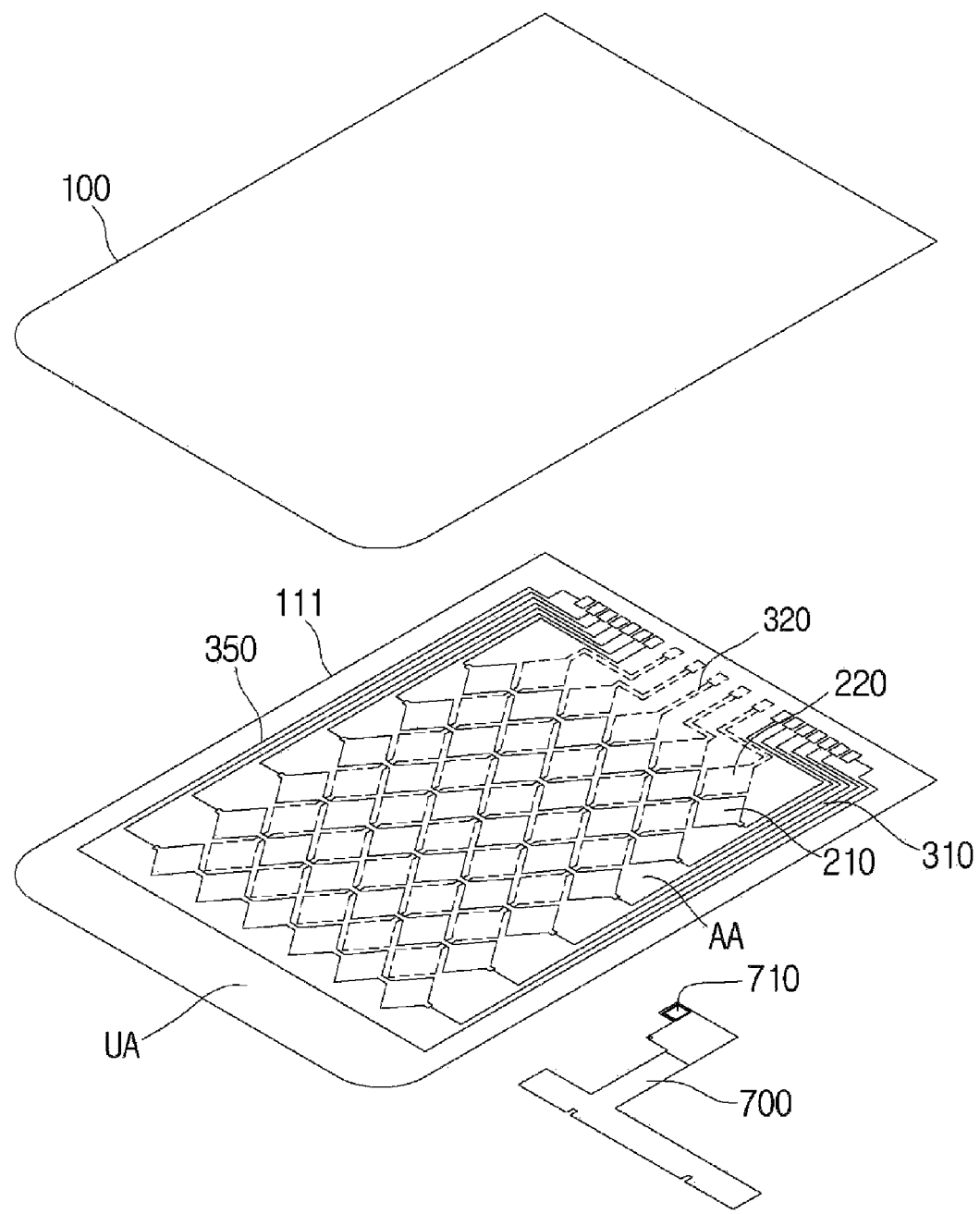

Referring to FIG. 8, the first sensing electrode 210 may be formed on one surface of glass or the film 111 provided under the cover window 100, and the second electrode 220 may be formed an opposite surface of the glass or the film 111. The ground wire may include the ground wire 350 provided on one surface of the film 111 and a ground wire (not shown) provided on the opposite surface of the film 111.

Figure 9:
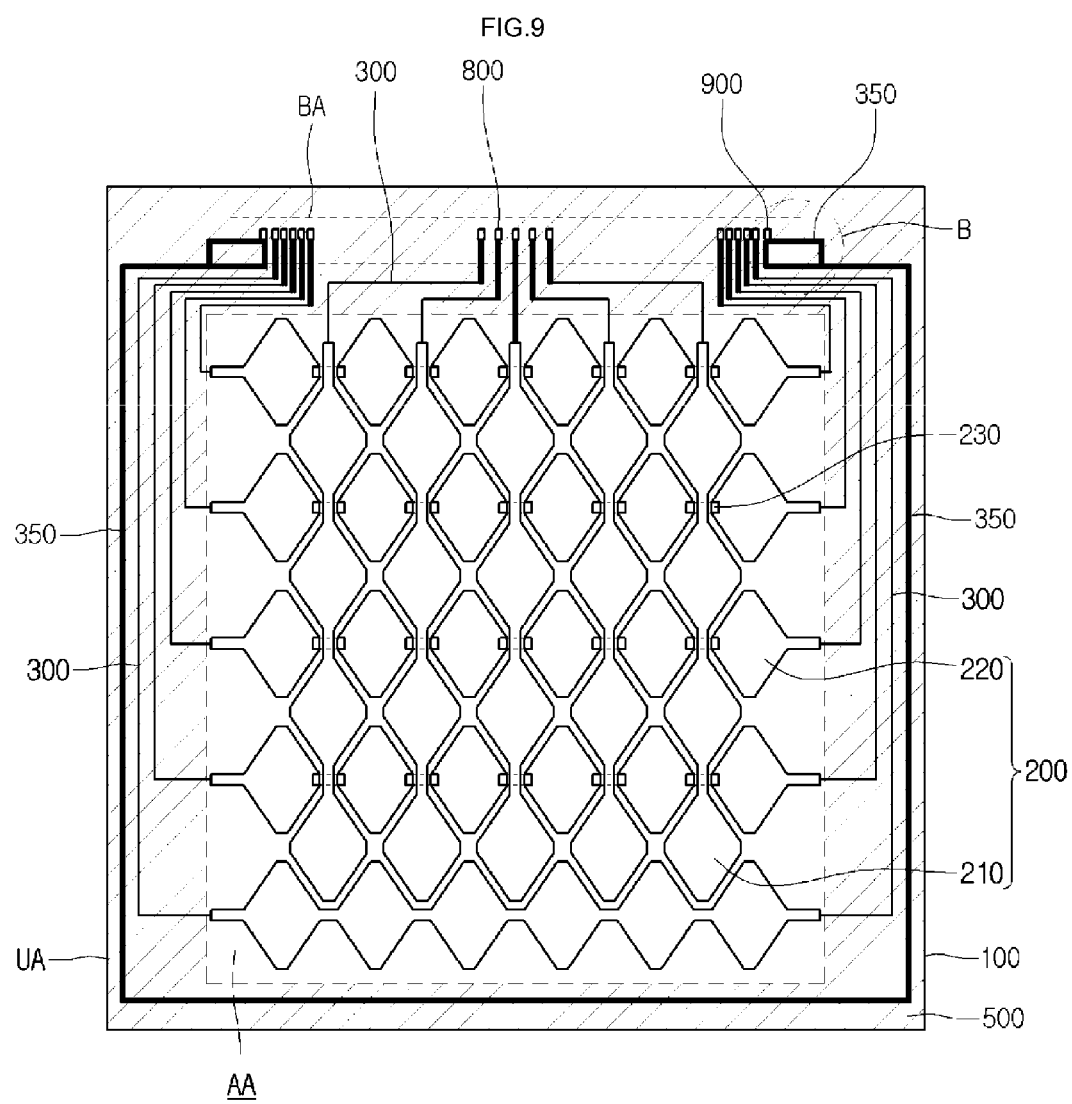
FIG. 9 is a top view showing the touch window according to another embodiment.
Figure 10:
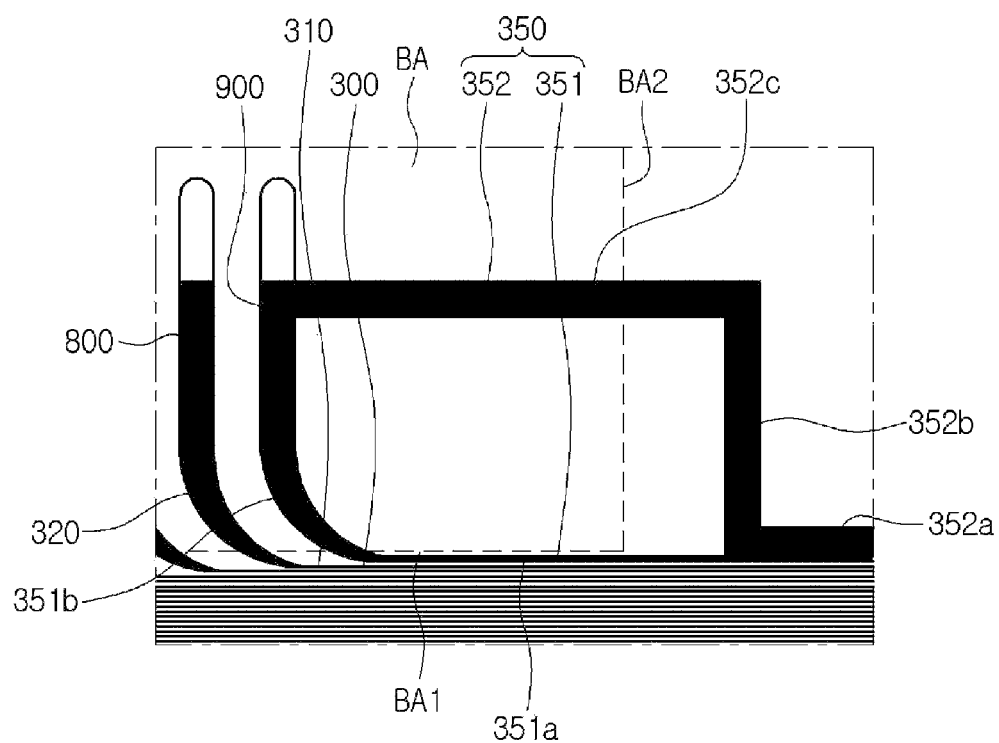
FIG. 10 is an enlarged view showing a part B of FIG. 9.

Referring to FIGS. 9 and 10, the ground wire 350 of the touch window according to another embodiment may include a first sub-ground wire 351 and a second sub-ground wire 352. The first sub-ground wire 351 may be connected with the second pad part 900 along the same path as that of the wire 300. The bonding part BA may include one side BA1 and another side BA2 bent from one side BA1.

The wire 300 may include the first wire part 310 parallel to one side BA1 of the bonding part BA and the second wire part 320 bent from the first wire part 310 and crossing one side BA1. The second wire part 320 crosses one side BA1 to make contact with the first pad part 800. The second wire part 320 may make contact with one side BA1.

Similarly, the first sub-ground wire 351 may include a 1a-sub-ground wire 351*a* parallel to one side BA1 of the bonding part BA and a 1b-sub-ground wire 351*b* bent from the 1a-sub-ground wire and crossing one side BA1. The 1b-sub-ground wire 351*b* crosses one side BA1 while making contact with the second pad part 900. The 1b-sub-ground wire 351*b* may make contact with one side BA1. Both of the wire 300 and the first sub-ground wire 351 may make contact with one side BA1 and may be connected with the first pad part 800 and the second pad part 900.

The second sub-ground wire 352 may branch from the first sub-ground wire 351. The second sub-ground wire 352 may branch in a direction different from that of the first sub-ground wire 351. The second sub-ground wire 352 may be provided on the bonding part BA. In other words, the second sub-ground wire 352 may be detoured to the bonding part BA.

For example, the second sub-ground wire 352 may include a 2a-sub-ground wire 352*a* parallel to one side BA1 of the bonding part BA, a 2b-sub-ground wire 352*b* bent from the 2a-sub-ground wire 352*a* and crossing one side BA1, and a 2c-sub-ground wire 352*c* bent from the 2b-sub-ground wire 352*b* and crossing another side BA2.

In this case, the 2c-sub-ground wire 352*c* may make contact with the second pad part 900. The 2c-sub-ground wire 352*c* crosses another side BA2 of the bonding part BA while making contact with the second pad part 900. In other words, the 2c-sub-ground wire 352*c* may make contact with another side BA2 without the contact with one side BA1.

Both of the first and second sub-ground wires 351 and 352 may be connected with the second pad part 900. In other words, the first and second sub-ground wires 351 and 352 may be connected with the same pad part 900.

The line width of the first sub-ground wire 351 may be different from the line width of the second sub-ground wire 352 on the bonding part BA. For example, the line width of the second sub-ground wire 352 may be wider than the line width of the first sub-ground wire 351. The first sub-ground wire 351 has a thinner line width, so that the size of an upper bezel can be reduced.

The second sub-ground wire 352 has a wider line width to enhance ESD protection. In other words, the ESD protection effect can be maximized in the touch window. Accordingly, the accuracy and the reliability of the touch can be improved.

Figure 11:
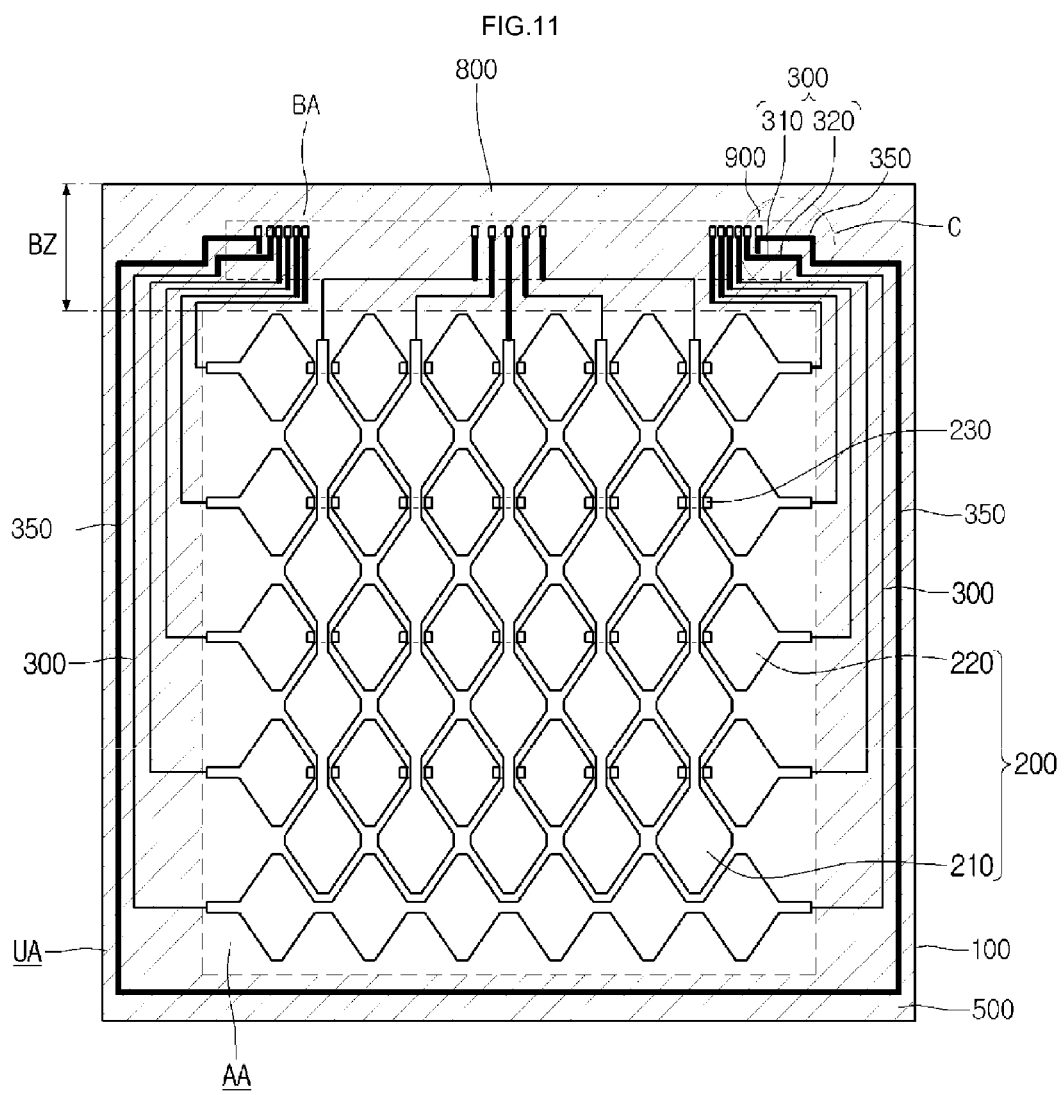
FIG. 11 is a top view showing a touch window according to another embodiment.
Figure 12:
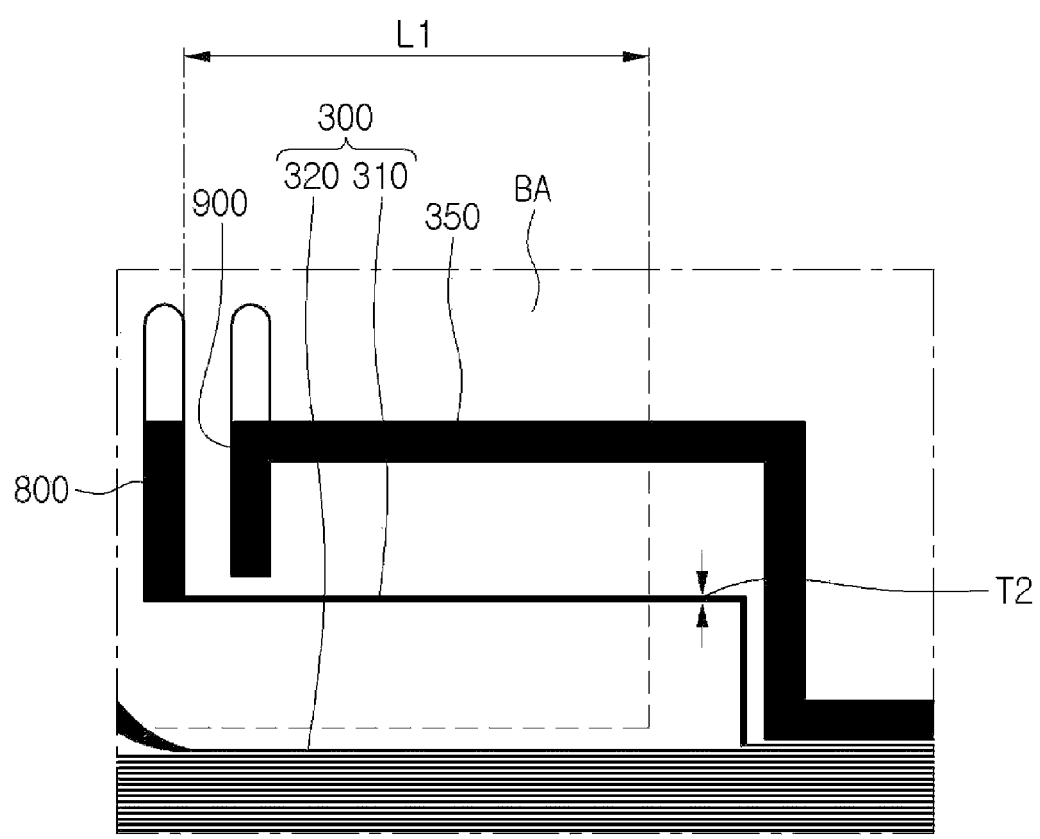
FIG. 12 is an enlarged view showing a part C of FIG. 11.

Referring to FIGS. 11 and 12, the wire 300 includes the first wire 310 and the second wire 320. The first wire 310 is a wire closest to the ground wire 350 in the wire 300. In this case, the overlap length L1 between the first wire 310 and the printed circuit board 700 is longer than the overlap length between the second wire 320 and the printed circuit board 700.

The overlap length L1 between the first wire 310 and the bonding part BA is longer than the overlap length between the second wire 320 and the bonding part BA.

Accordingly, different from the second wire 320, the first wire 310 may be detoured to the bonding part BA to make contact with the first pad part 800. A portion of the first wire 310 may be provided at a lateral side of the printed circuit board 700. In addition, a portion of the first wire 310 may be provided at a lateral side of the bonding part BA to reduce the width of the bezel BZ. The width of the bezel BZ is reduced by the line width T2 of the first wire 310 to enlarge the active area AA. Therefore, a wider screen can be ensured.

The bending number of the first wire 310 may be larger than that of the second wire 320. The bending number of the first wire 310 may be larger than the bending number of the second wire 320 at the upper portion of the substrate 100 in which the bonding part BA is provided.

At the area adjacent to the bonding part BA, the bending number of the first wire 310 may be larger than the bending number of the second wire 320. The number of the parts bent due to the directionality change of the first wire 310 may be larger than the number of the part bent due to the directionality change of the second wire 320. This is because the first wire 310 makes a detour to a part in which the printed circuit board 700 is provided.

Figure 13:
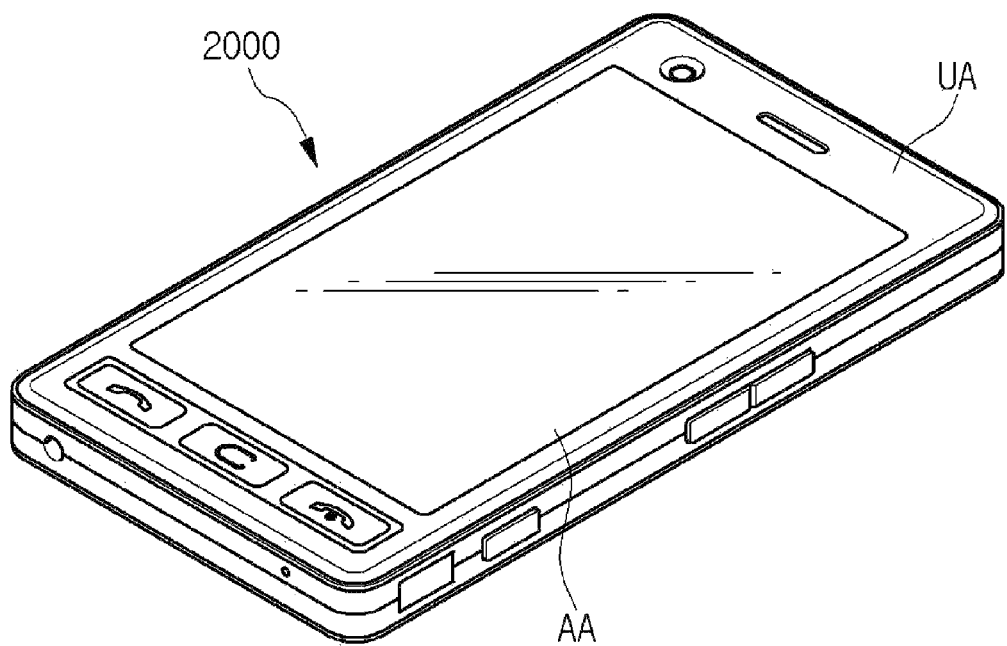
FIG. 13 is a perspective view showing one example of a display device to which the touch window according to the embodiment is applied.

Meanwhile, although drawings show that the ground wire 350 and the first wire 310 are detoured to the bonding part BA, the embodiment is not limited thereto. Accordingly, the second wire 320 adjacent to the first wire 310 may be arranged similarly to the first wire 310. In other words, the second wire 320 may be detoured to the bonding part BA to more reduce the width of the bezel BZ. FIG. 13 is a view showing a display device including the above-described touch window. Hereinafter, a mobile terminal 2000 will be described as an example of the display device.

Referring to FIG. 13, the mobile terminal 2000 may include an active area AA and an unactive area UA. The active area AA senses a touch signal through a touch by a finger, and an instruction icon pattern part and a logo may be formed. Although FIG. 13 shows a mobile terminal for the illustrative purpose, the above-described electrode member and touch window can be used in various electronic products, such a vehicle or a home appliance, employing a display, in addition to the mobile terminal.

The embodiment provides a touch window having improved reliability.

The embodiment provides a touch window capable of ensuring a wider screen by narrowing the width of a bezel.

According to the embodiment, there is provided a touch window comprising a substrate, a sensing electrode on the substrate, a wire electrically connected with the sensing electrode, a ground wire adjacent to the wire, and a printed circuit board connected with the wire and the ground wire. An overlap length between the ground wire and the printed circuit board is longer than an overlap length between the wire and the printed circuit board.

According to the embodiment, an overlap length between the ground wire and the printed circuit board is longer than an overlap length between the wire and the printed circuit board.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch window comprising:
a substrate;
a sensing electrode on the substrate;
a wire electrically connected with the sensing electrode;
a ground wire adjacent to the wire; and
a printed circuit board connected with the wire and the ground wire,
wherein an overlap length between the ground wire and the printed circuit board is longer than an overlap length between the wire and the printed circuit board, and
wherein the substrate includes a bonding part in which the printed circuit board is provided, and a distance between the bonding part and a wire closest to the bonding part is in a range of 0.01 mm to 0.03 mm.

2. The touch window of claim 1, wherein a distance between the wire and the printed circuit board is narrower than a line width of the ground wire.

3. The touch window of claim 1, wherein the ground wire has a line width in a range of 0.03 mm to 0.40 mm.

4. The touch window of claim 1, wherein the ground wire has a direction different than a direction of the wire.

5. The touch window of claim 1, wherein a portion of the ground wire is provided at a lateral side of the printed circuit board.

6. The touch window of claim 1, wherein the ground wire includes a first sub-ground wire and a second sub-ground wire that branches from the first sub-ground wire.

7. The touch window of claim 6, wherein the first sub-ground wire has a line width different from a line width of the second sub-ground wire.

8. The touch window of claim 6, wherein the second sub-ground wire is provided on the bonding part, and has a line width thicker than a line width of the first sub-ground wire.

9. The touch window of claim 6, further comprising a pad part provided at one end of the ground wire and making contact with the printed circuit board.

10. The touch window of claim 9, wherein the first and second sub-ground wires are connected with the pad part.

11. The touch window of claim 6, wherein the first sub-ground wire and the second sub-ground wire are provided in directions different from each other and connected with one pad part.

12. The touch window of claim 1, wherein the wire includes first and second wires, and an overlap length between the first wire and the printed circuit board is longer than an overlap length between the second wire and the printed circuit board.

13. The touch window of claim 12, wherein the first wire is closest to the ground wire.

14. The touch window of claim 1, wherein a bending number of the ground wire is larger than a bending number of the wire at an upper portion of the substrate in which the bonding part is provided.

15. A touch window comprising:
a substrate;
a sensing electrode on the substrate;
a wire electrically connected with the sensing electrode;
a ground wire adjacent to the wire; and
a printed circuit board connected with the wire and the ground wire,
wherein a line width of the ground wire is wider than a distance between the wire parallel to the printed circuit board and the printed circuit board,
wherein the ground wire includes a first sub-ground wire and a second sub-ground wire that branches from the first sub-ground wire, and
wherein the substrate includes a bonding part in which the printed circuit board is provided, and the second sub-ground wire is provided on the bonding part and has a line width wider than a line width of the first sub-ground wire.

16. The touch window of claim 15, wherein a bending number of the ground wire is larger than a bending number of the wire at an upper portion of the substrate in which the bonding part is provided.

* * * * *